United States Patent
Wakabayashi et al.

(10) Patent No.: US 7,390,688 B2
(45) Date of Patent: Jun. 24, 2008

(54) SEMICONDUCTOR DEVICE AND MANUFACTURING METHOD THEREOF

(75) Inventors: Takeshi Wakabayashi, Sayama (JP); Ichiro Mihara, Tachikawa (JP)

(73) Assignee: Casio Computer Co.,Ltd., Tokyo (JP)

( * ) Notice: Subject to any disclaimer, the term of this patent is extended or adjusted under 35 U.S.C. 154(b) by 29 days.

(21) Appl. No.: 11/349,779

(22) Filed: Feb. 8, 2006

(65) Prior Publication Data

US 2006/0186542 A1 Aug. 24, 2006

(30) Foreign Application Priority Data

Feb. 21, 2005 (JP) .............. 2005-043738
Feb. 21, 2005 (JP) .............. 2005-043739

(51) Int. Cl.
*H01L 21/00* (2006.01)

(52) U.S. Cl. .............. 438/68; 438/113; 257/E21.503

(58) Field of Classification Search .............. 438/68, 438/113, 110; 257/E21.503
See application file for complete search history.

(56) References Cited

U.S. PATENT DOCUMENTS

| 2001/0033016 | A1 | 10/2001 | Sumikawa et al. |
| 2003/0162328 | A1* | 8/2003 | Ohuchi et al. .............. 438/113 |
| 2003/0215980 | A1* | 11/2003 | Otaki .............. 438/106 |
| 2004/0121563 | A1 | 6/2004 | Farnworth et al. |
| 2005/0181540 | A1* | 8/2005 | Farnworth et al. .......... 438/113 |
| 2006/0024924 | A1* | 2/2006 | Haji et al. .............. 438/464 |
| 2006/0249853 | A1 | 11/2006 | Sumikawa et al. |

FOREIGN PATENT DOCUMENTS

| JP | 09-270400 A | 10/1997 |
| JP | 2000-353696 A | 12/2000 |
| JP | 2001-230224 A | 8/2001 |
| JP | 2002-083839 | 3/2002 |
| JP | 2002-353347 | 12/2002 |
| JP | 2002-353369 | 12/2002 |
| JP | 2003-309228 | 10/2003 |
| JP | 2004-207267 | 7/2004 |
| JP | 2005-296690 | 10/2004 |
| KR | 2001-0095216 A | 11/2001 |
| KR | 2002-0074400 A | 9/2002 |
| KR | 2004-0057934 A | 7/2004 |
| WO | WO 98/043289 A1 | 10/1998 |

OTHER PUBLICATIONS

Chinese Office Action (and English translation thereof) dated Dec. 28, 2007, issued in a counterpart Chinese Application.
English language version of Japanese Office Action dated Dec. 4, 2007, issued in a counterpart Japanese Application.

* cited by examiner

*Primary Examiner*—Phat X Cao
(74) *Attorney, Agent, or Firm*—Frishauf, Holtz, Goodman & Chick, P.C.

(57) ABSTRACT

A semiconductor device includes a semiconductor substrate which has an integrated circuit formed on a front surface thereof, and a rough surface with a height difference of 1 to 5 µm on a rear surface thereof. A protective film is provided on the rear surface of the semiconductor substrate.

17 Claims, 24 Drawing Sheets

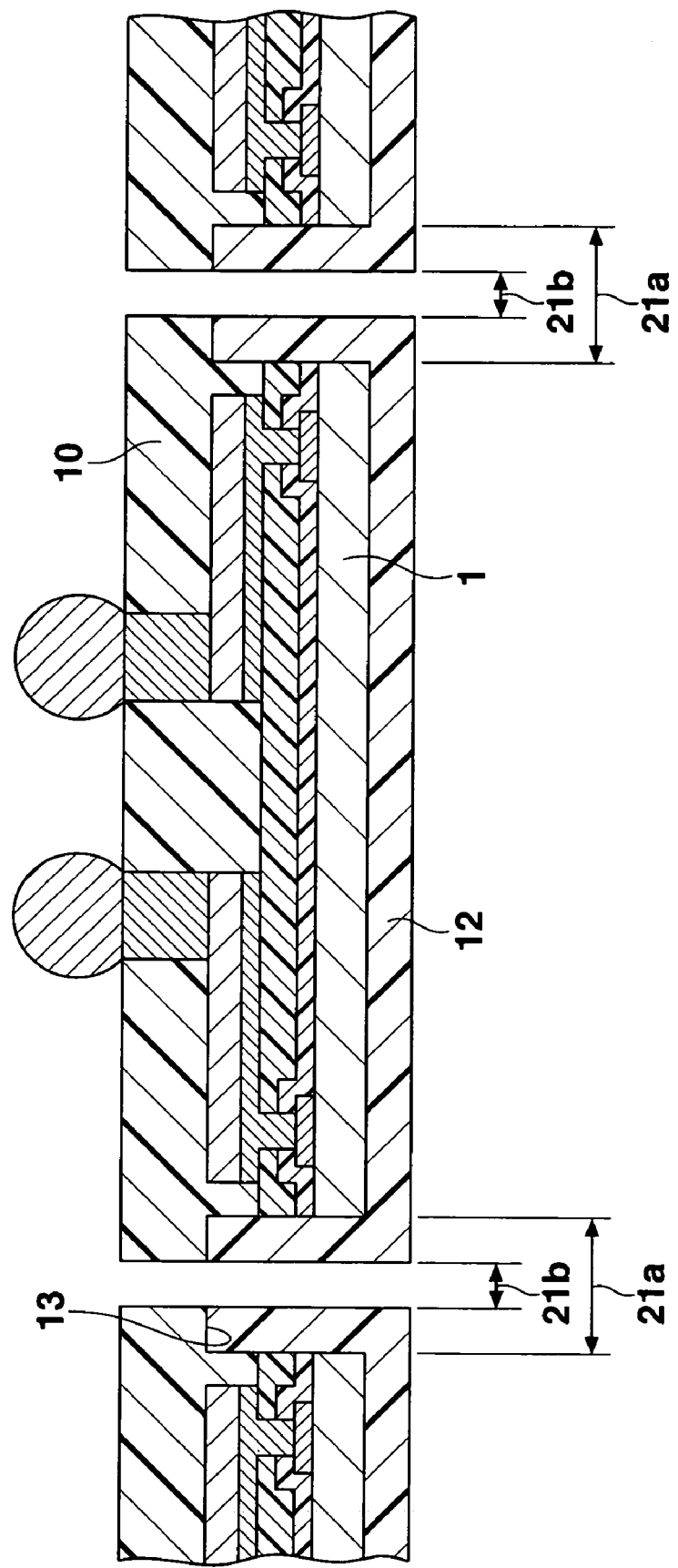

SEMICONDUCTOR DEVICE AND MANUFACTURING METHOD THEREOF

CROSS-REFERENCE TO RELATED APPLICATIONS

This application is based upon and claims the benefit of priority from prior Japanese Patent Applications No. 2005-043738, filed Feb. 21, 2005; and No. 2005-043739, filed Feb. 21, 2005, the entire contents of both of which are incorporated herein by reference.

BACKGROUND OF THE INVENTION

1. Field of the Invention

This invention relates to a semiconductor device and a manufacturing method thereof.

2. Description of the Related Art

There has been a demand for thinner semiconductor devices as electronic equipment becomes thinner. However, if a semiconductor substrate in a wafer state is made too thin, the semiconductor substrate is damaged in a semiconductor manufacturing process in which integrated circuits are formed on a front surface of the semiconductor substrate in the wafer state. Thus, a technique has been developed wherein after the integrated circuits are formed on the front surface of the semiconductor substrate in the wafer state having a predetermined thickness, a rear surface opposite to the surface on which the integrated circuits are formed is ground to reduce the thickness of the semiconductor substrate. Jpn. Pat. Appln. KOKAI Publication No. 2001-230224 discloses such a method of manufacturing a conventional semiconductor device. This prior document discloses a method which comprises: grinding a rear surface of a semiconductor substrate in a wafer state in which integrated circuits and external connection electrodes are formed on a front surface side thereof; forming a protective film made of a resin on the rear surface of the semiconductor substrate in the wafer state; and cutting, after passing through predetermined subsequent steps, the semiconductor substrate in the wafer state to obtain a plurality of semiconductor devices.

In the semiconductor device obtained by the conventional manufacturing method described above, the rear surface of the semiconductor substrate is ground to form minute and acutely-angled irregularities on the rear surface of the semiconductor substrate, so that even if a protective film made of a resin is formed on the minute and acutely-angled irregular surface, it is difficult to ensure that the resin is filled into the inner part of the minute and acutely-angled concave portions. As a result, there is a problem that cracks may be caused in the rear surface of the semiconductor substrate due to the fact that the inner parts of the minute and acutely-angled concave portions are not covered with the protective film.

BRIEF SUMMARY OF THE INVENTION

It is an object of this invention to provide a semiconductor device and a manufacturing method thereof capable of preventing cracks from being easily caused in a rear surface of a semiconductor substrate.

According to an aspect of this invention, there is provided a semiconductor device comprising: a semiconductor substrate which has an integrated circuit formed on a front surface thereof, and a rough surface with a height difference of 1 to 5 μm on a rear surface thereof; and a protective film provided on the rear surface of the semiconductor substrate.

According to this semiconductor device, the rear surface of the semiconductor substrate is a rough surface having a height difference of 1 to 5 μm, and this ensures that the rough surface can be covered with the protective film, thereby making it possible to prevent the cracks from being easily caused in the rear surface of the semiconductor substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 26 is a sectional view of a step subsequent to FIG. 25.

DETAILED DESCRIPTION OF THE INVENTION

First Embodiment

Figure 1:
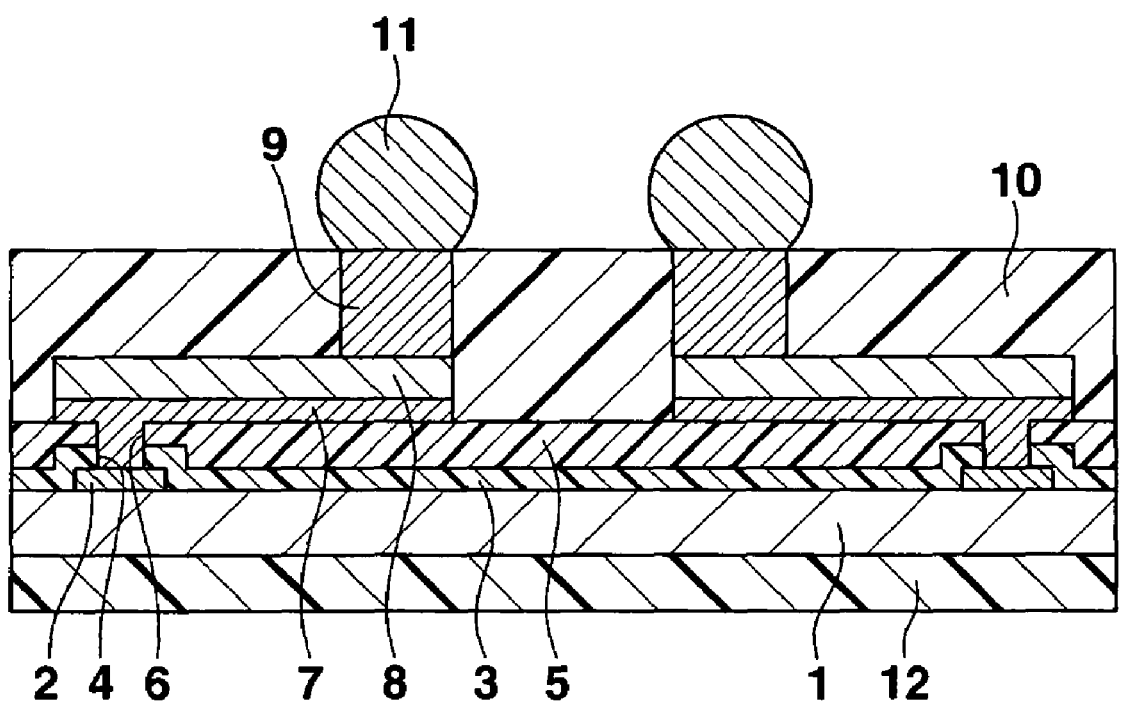
FIG. 1 is a sectional view of a semiconductor device as a first embodiment of the invention.

FIG. 1 shows a sectional view of a semiconductor device as a first embodiment of the invention. The semiconductor device is generally called a chip size package (CSP), and has a silicon substrate (semiconductor substrate) 1. An integrated circuit (not shown) having a predetermined function is provided on an upper surface of the silicon substrate 1. A plurality of connection pads 2 made of an aluminum-based metal or the like are provided on the periphery of the upper surface of the substrate in such a manner as to be connected to the integrated circuit.

An insulating film 3 made of silicon oxide or the like is provided on the upper surface of the silicon substrate 1 except for the center of the respective connection pad 2, so that the center of the connection pad 2 is exposed via an opening 4 provided in the insulating film 3. A protective film 5 made of an epoxy-based resin, a polyimide-based resin or the like is provided on an upper surface of the insulating film 3. In this case, an opening 6 is provided in the protective film 5 in a part corresponding to each of the openings 4 of the insulating film 3.

Foundation metal layers 7 made of copper or the like are provided on an upper surface of the protective film 5. A wiring line 8 made of copper is provided on an entire upper surface of each of the foundation metal layers 7. One end of the wiring line 8 including the foundation metal layer 7 is electrically connected to the connection pad 2 via the openings 4 and 6 of the insulating film 3 and the protective film 5. A columnar electrode 9 made of copper is provided on an upper surface of the connection pad of the wiring line 8.

A sealing film 10 made of an epoxy-based resin, a polyimide-based resin or the like covers the upper surface of the protective film 5 including the wiring line 8 such that an upper surface of the sealing film 10 forms one surface together with an upper surface of the columnar electrode 9. A solder ball 11 is provided on the upper surface of the columnar electrode 9. A protective film 12 made of an epoxy-based resin, a polyimide-based resin or the like is provided on a lower surface (rear surface) of the silicon substrate 1.

Figure 2:
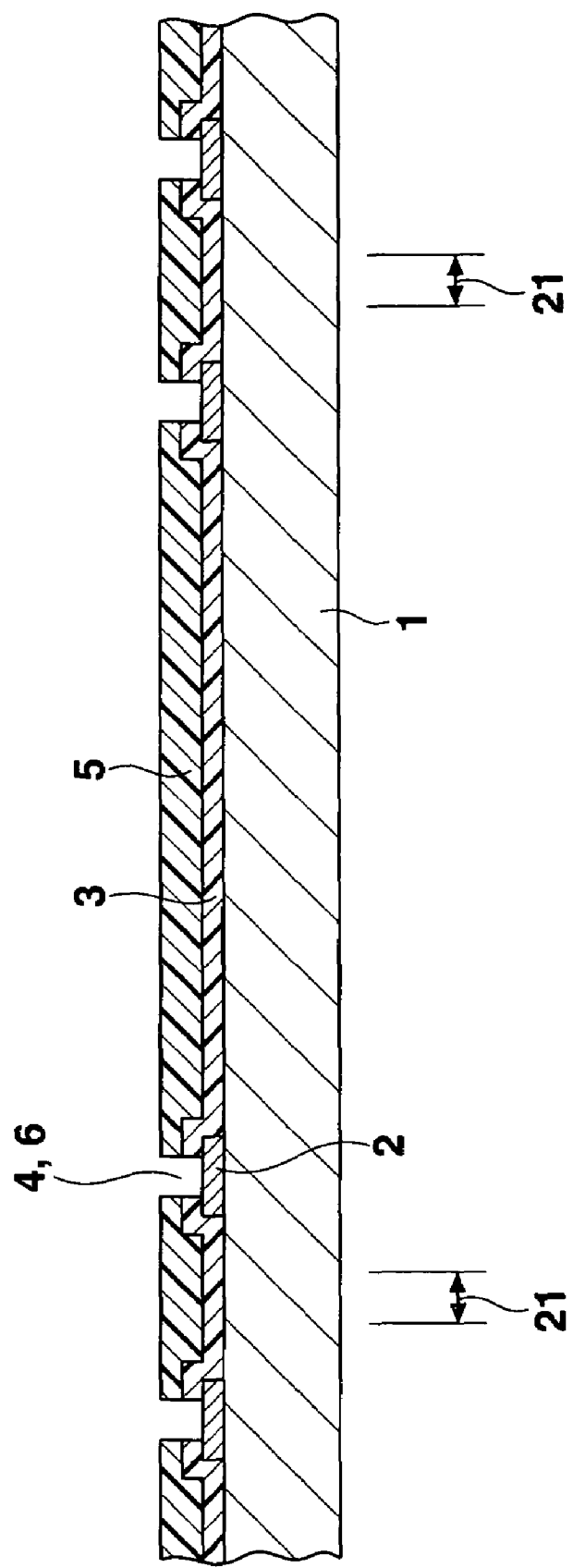
FIG. 2 is a sectional view of initially prepared components in one example of a method of manufacturing the semiconductor device shown in FIG. 1.

Next, one example of a method of manufacturing such a semiconductor device shown in FIG. 1 will be described. First, as shown in FIG. 2, a material is prepared in which there are provided, on the silicon substrate (semiconductor substrate) 1 in a wafer state, the connection pads 2 made of an aluminum-based metal or the like, the insulating film 3 made of silicon oxide or the like, and the protective film 5 made of an epoxy-based resin, a polyimide-based resin or the like. The center of each of the connection pads 2 is exposed via the openings 4 and 6 formed in the insulating film 3 and the protective film 5.

In this case, each of the integrated circuits having the predetermined function is formed on the silicon substrate 1 in the wafer state in an area where each of the semiconductor devices is formed. Each of the connection pads 2 is electrically connected to the integrated circuit formed in the corresponding area. Further, the thickness of the silicon substrate 1 in the wafer state is somewhat larger than the thickness of the silicon substrate 1 shown in FIG. 1, or final substrate. It is to be noted that in FIG. 2, an area indicated by 21 is an area corresponding to a dicing street.

Figure 3:
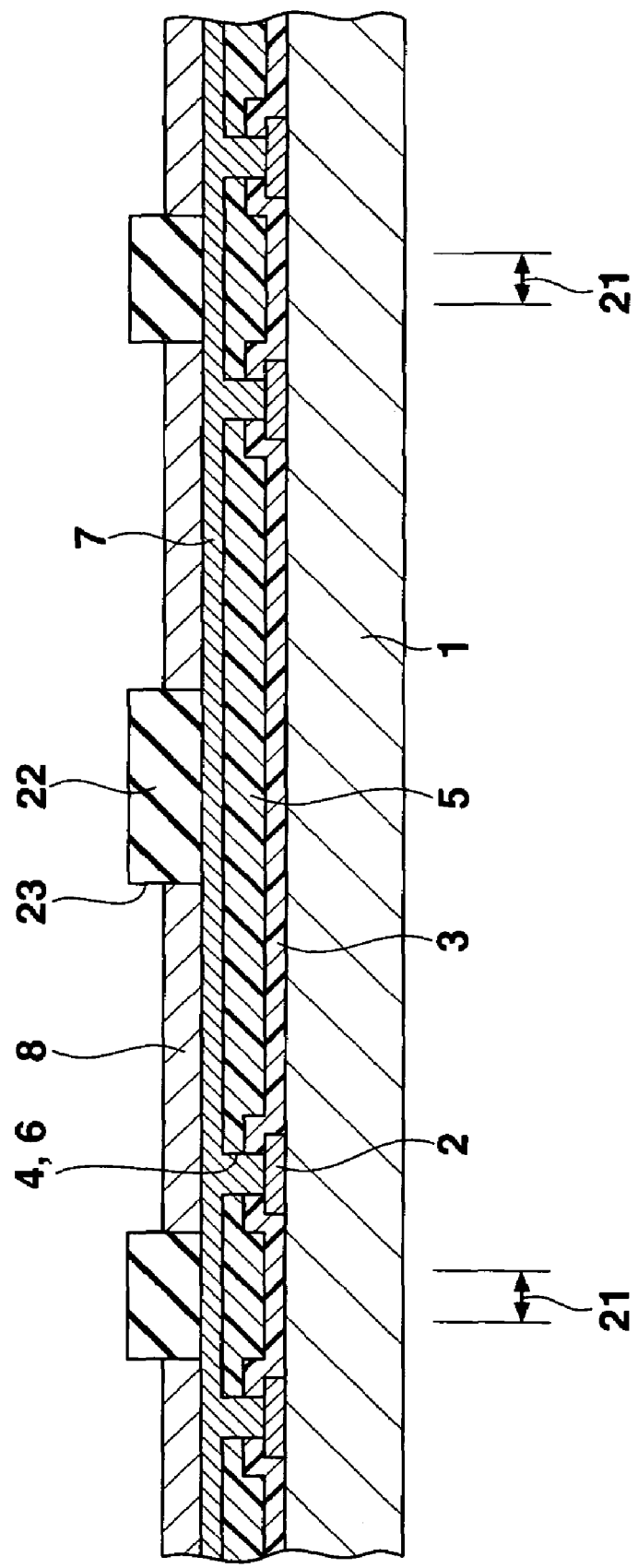
FIG. 3 is a sectional view of a step subsequent to FIG. 2.

Next, as shown in FIG. 3, the foundation metal layer 7 is formed on the entire upper surface of the protective film 5 including the upper surface of the connection pad 2 exposed via the openings 4 and 6 of the insulating film 3 and the protective film 5. In this case, the foundation metal layer 7 may only be a copper layer formed by electroless plating, may only be a copper layer formed by sputtering, and may be a copper layer formed by sputtering on a thin film layer such as titanium formed by sputtering.

Next, a plating resist film 22 is formed and patterned on the upper surface of the foundation metal layer 7. In this case, an opening 23 is formed in the plating resist film 22 in a part corresponding to an area where the wiring line 8 is formed. Then, electrolytic plating with copper is carried out using the foundation metal layer 7 as a plating current path, thereby forming the wiring line 8 on the upper surface of the foundation metal layer 7 in the opening 23 of the plating resist film 22. Then, the plating resist film 22 is removed.

Figure 4:
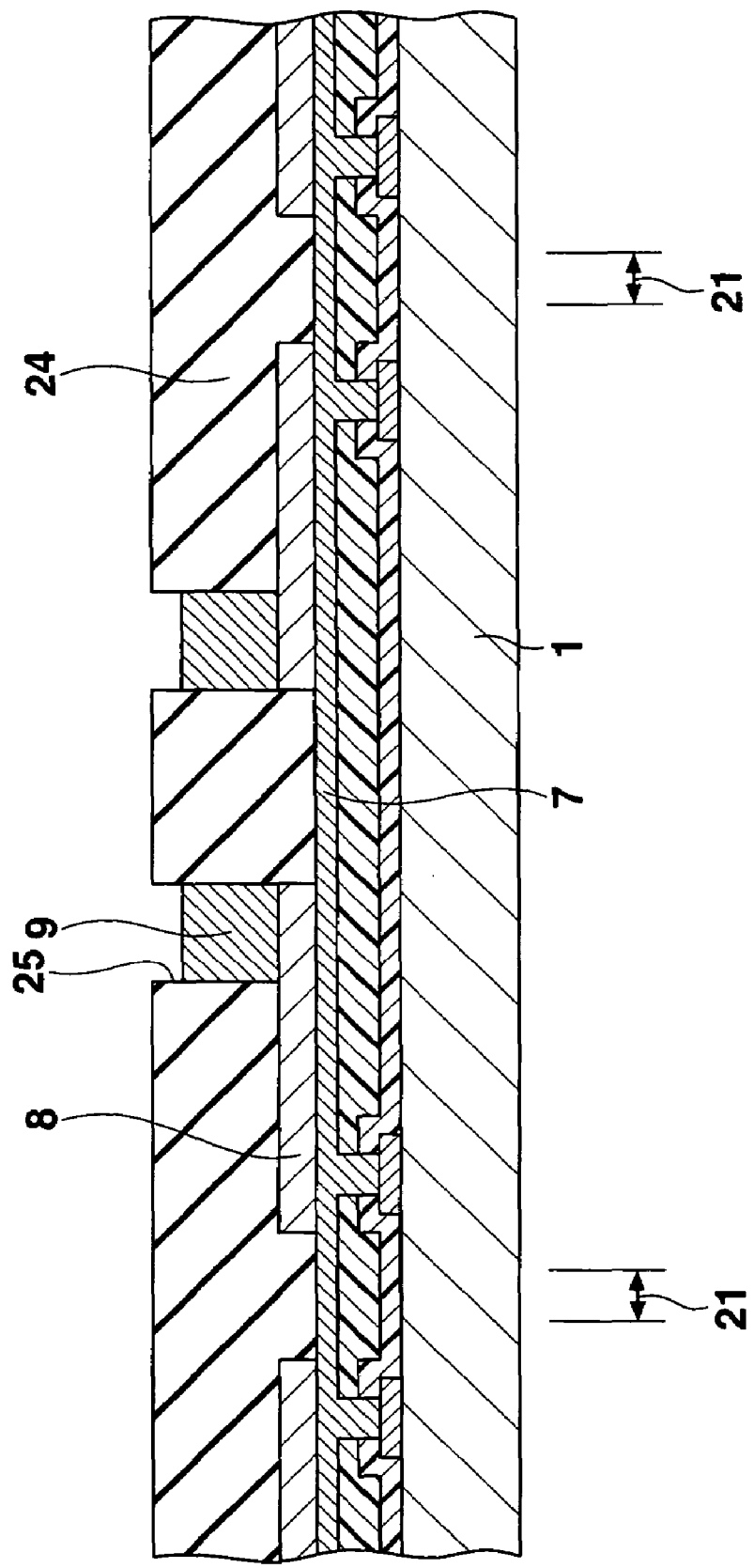
FIG. 4 is a sectional view of a step subsequent to FIG. 3.
Figure 5:
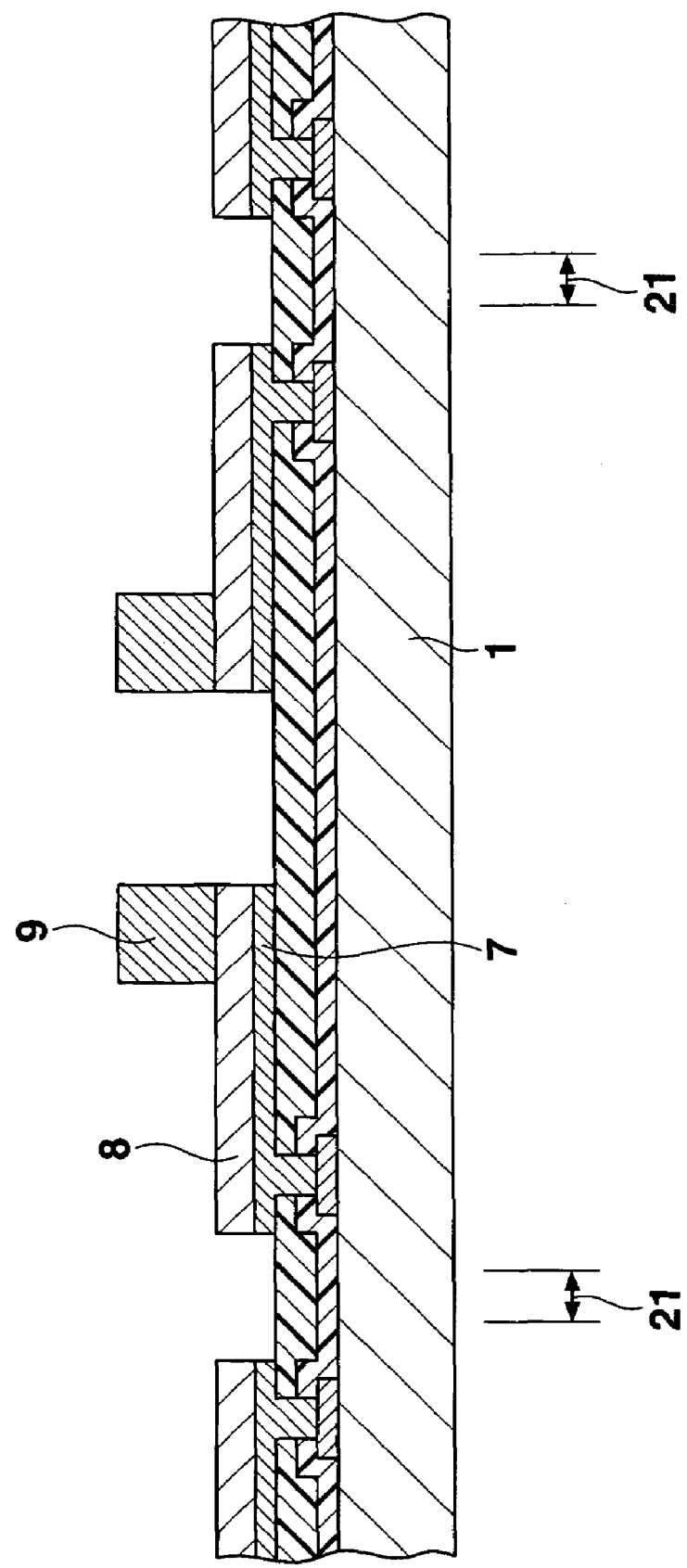
FIG. 5 is a sectional view of a step subsequent to FIG. 4.

Next, as shown in FIG. 4, a plating resist film 24 is formed and patterned on the upper surface of the foundation metal layer 7 including the wiring line 8. In this case, an opening 25 is formed in the plating resist film 24 in a part corresponding to an area where the columnar electrode 9 is formed. Then, electrolytic plating with copper is carried out using the foundation metal layer 7 as a plating current path, thereby forming the columnar electrode 9 on the upper surface of the connection pad of the wiring line 8 in the opening 25 of the plating resist film 24. Subsequently, the plating resist film 24 is removed, and then unnecessary portions of the foundation metal layer 7 are etched and removed using the wiring line 8 as a mask, whereby the foundation metal layer 7 remains under the wiring line 8 alone, as shown in FIG. 5.

Figure 6:
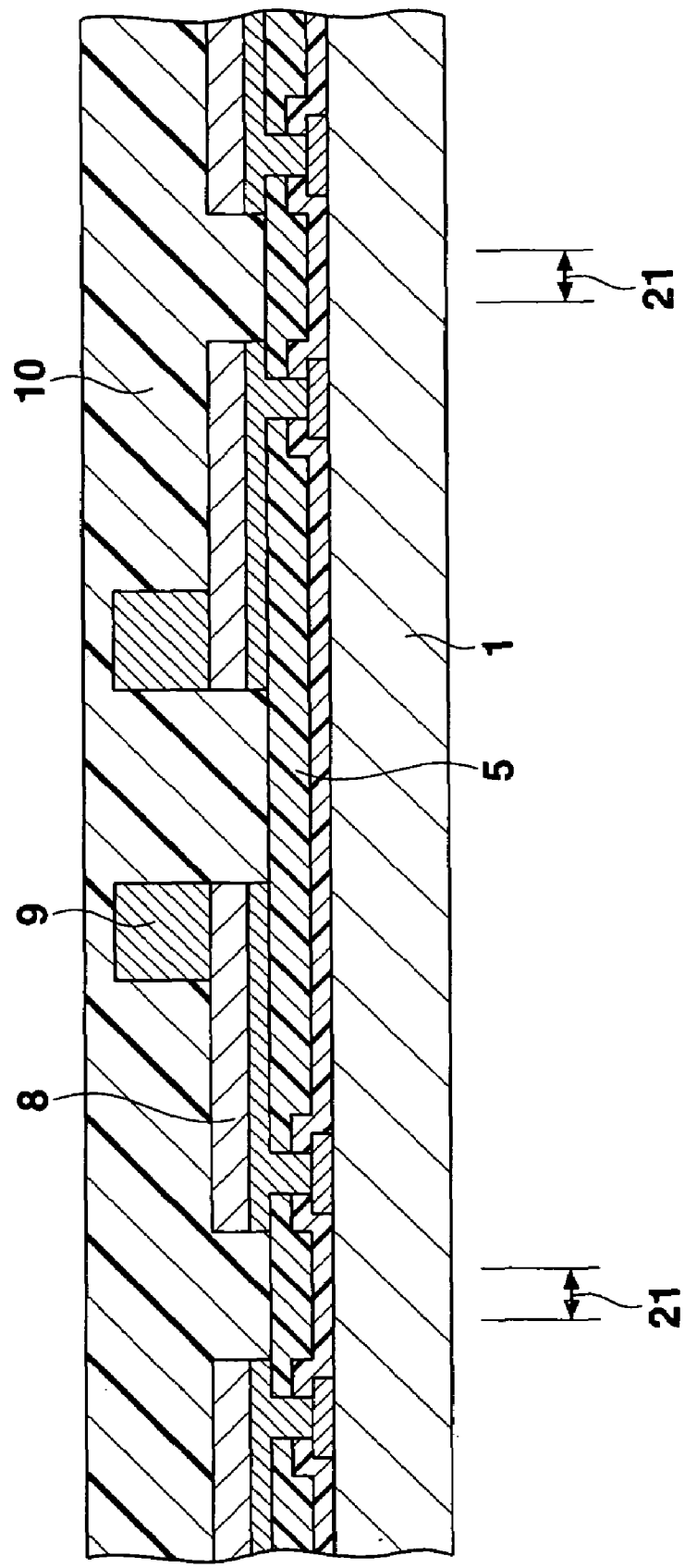
FIG. 6 is a sectional view of a step subsequent to FIG. 5.

Next, as shown in FIG. 6, the sealing film 10 made of an epoxy-based resin, a polyimide-based resin or the like is formed on the exposed upper surfaces of the protective film 5, the columnar electrodes 9 and the wiring lines 8 by a screen printing method, a spin coat method or the like so that the thickness of the sealing film 10 is larger than the height of the columnar electrode 9. Therefore, in this state, the upper surface of the columnar electrode 9 is covered with a part of the sealing film 10.

Figure 7:
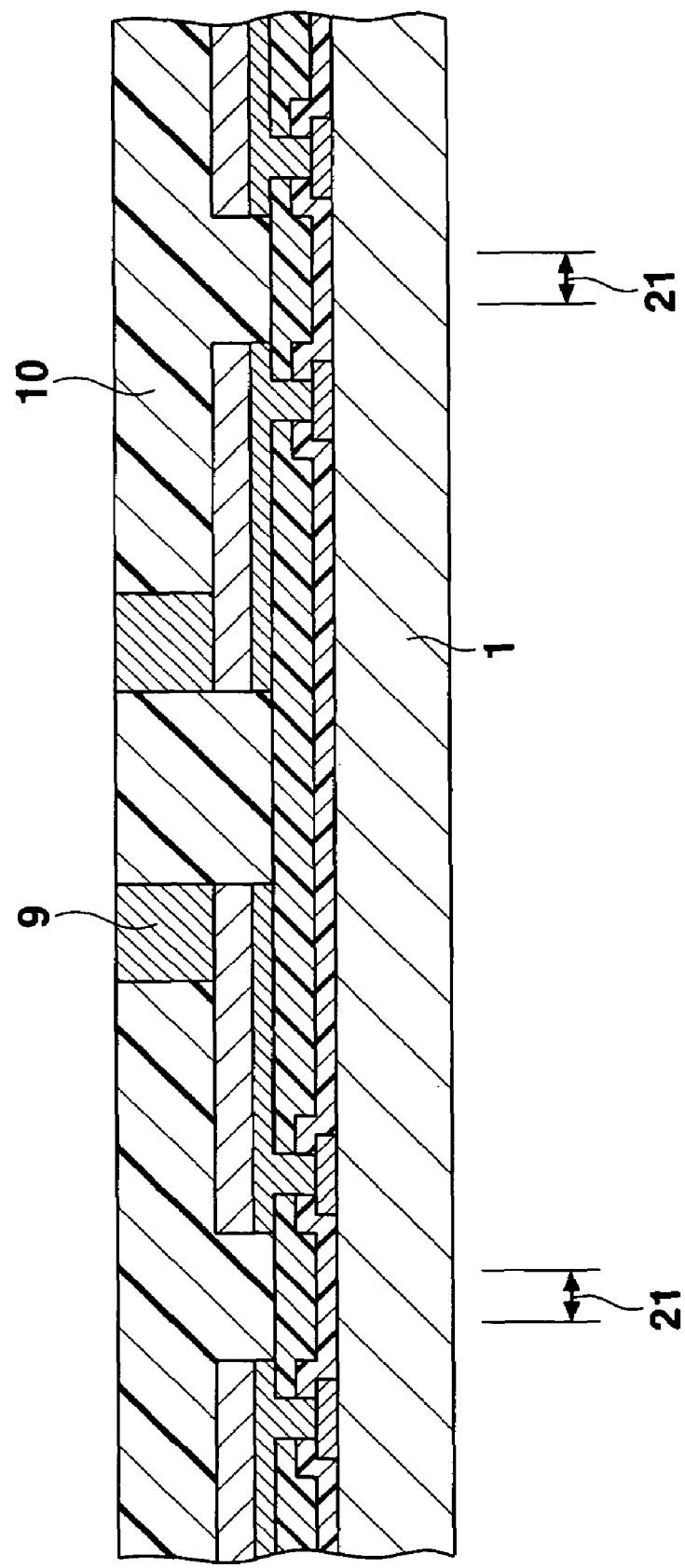
FIG. 7 is a sectional view of a step subsequent to FIG. 6.

Next, upper surface sides of the sealing film 10 and the columnar electrode 9 are properly polished, so that as shown in FIG. 7, the upper surface of the columnar electrode 9 is exposed, and the upper surface of the sealing film 10 including the exposed upper surface of the columnar electrode 9 is planarized. Here, the upper surface side of the columnar electrode 9 is properly polished for the reason that, due to variation in the height of the columnar electrode 9 formed by electrolytic plating, this variation is eliminated to make uniform the height of the columnar electrode 9.

Figure 8:
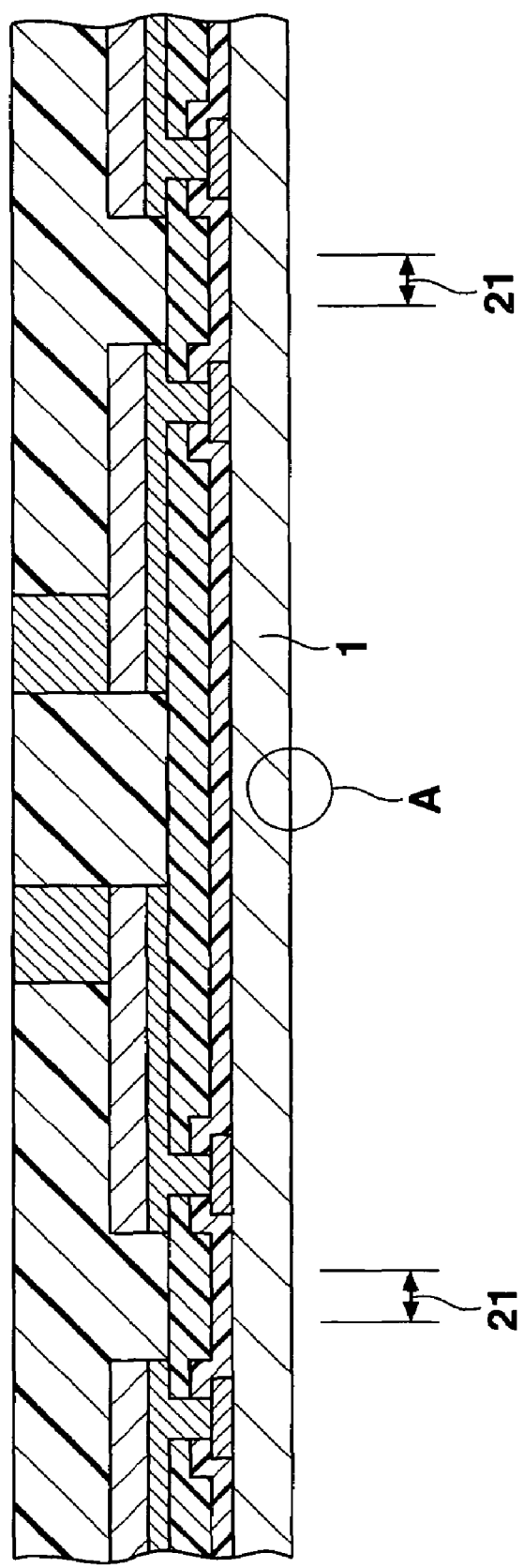
FIG. 8 is a sectional view of a step subsequent to FIG. 7.
Figure 9:
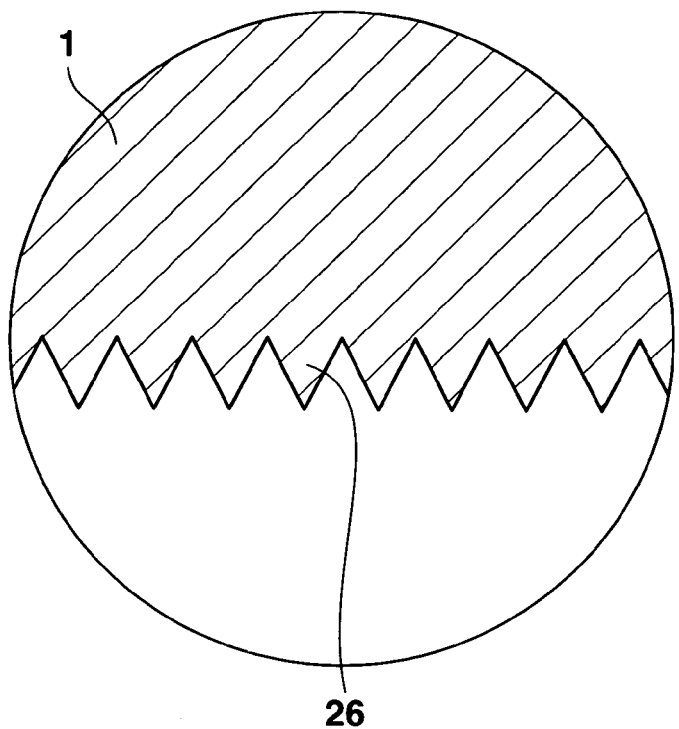
FIG. 9 is a partially enlarged sectional view showing an A portion of FIG. 8 in detail.

Next, as shown in FIG. 8, the lower surface (rear surface) side of the silicon substrate 1 is properly ground or polished to reduce the thickness of the silicon substrate 1. Here, if the lower surface of the silicon substrate 1 in the wafer state is ground or polished, minute and acutely-angled irregularities (a silicon crystal-destroyed layer) 26 are inevitably formed on the lower surface of the silicon substrate 1 as shown in FIG. 9 which is a partially enlarged sectional view showing an A portion of FIG. 8 in detail. The minute and acutely-angled irregularities 26 cause cracks in the lower surface of the silicon substrate 1.

Figure 10:
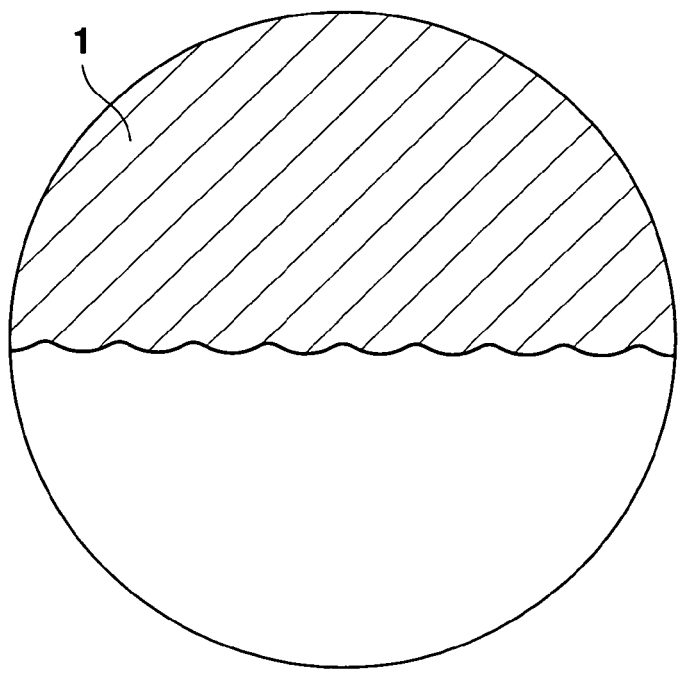
FIG. 10 is a partially enlarged sectional view of a step subsequent to FIG. 9.

Thus, wet etching is then implemented which uses a mixed solution of nitric acid, hydrofluoric acid and acetic acid or this mixed solution to which water has been added. In this wet etching, the lower surface of the silicon substrate 1 is oxidized by nitric acid to form an oxide film, and this oxide film is dissolved by hydrofluoric acid and removed, and then a reaction is controlled by acetic acid. In this case, the lower surface of the silicon substrate 1 can be mirror-finished depending on conditions such as a composition ratio and/or processing time of the mixed solution, but it is desirable that each of the silicon substrates 1 be finished as a rough surface in which a large number of substantially arc-shaped convex portions with relatively smooth conjunction between the arc-shaped convex portions are formed so that the silicon substrate 1 is less susceptible to light, as schematically shown in FIG. 10. Moreover, in this case, a height difference (a distance between a maximum concave portion and a maximum convex portion adjacent to each other) of the rough surface formed on the lower surface of the silicon substrate 1 is suitably 1 to 5 µm.

Figure 11:
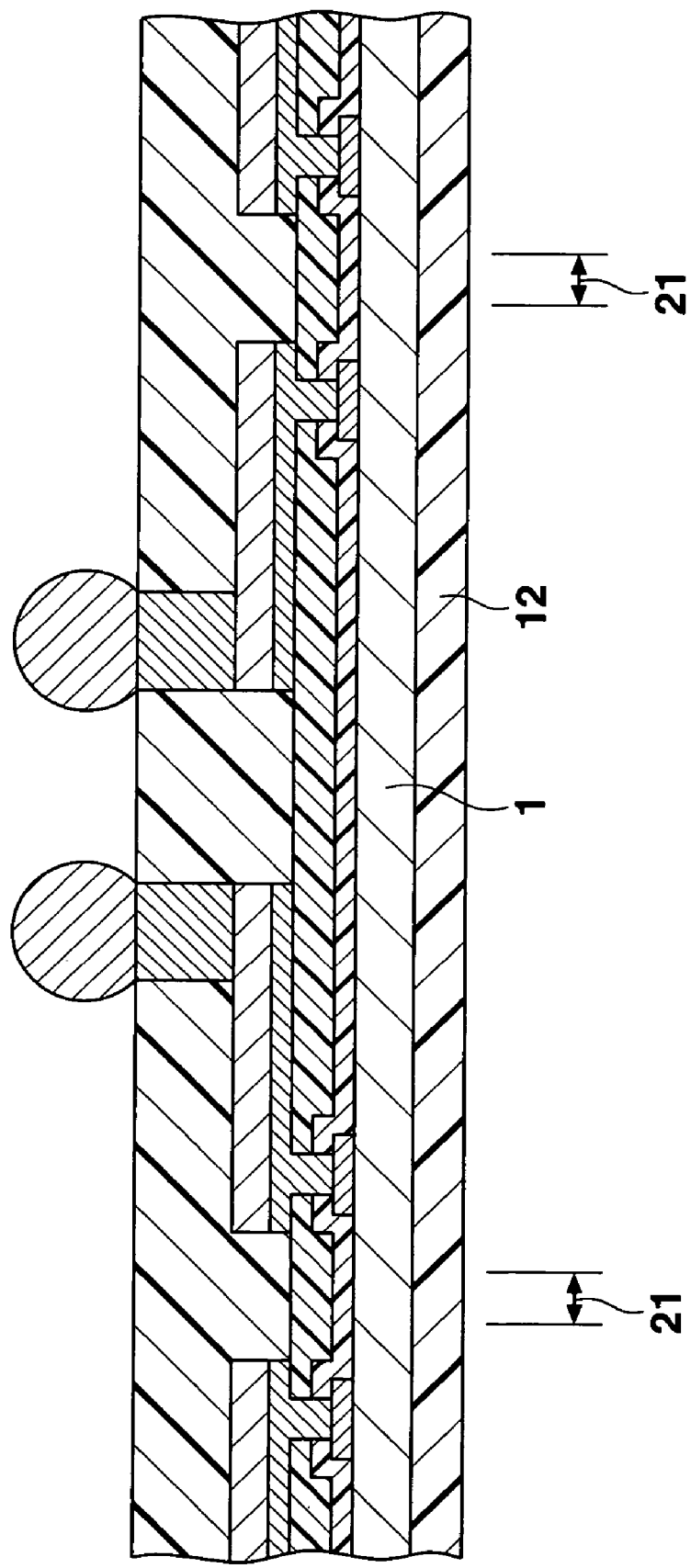
FIG. 11 is a sectional view of a step subsequent to FIG. 10.

Next, as shown in FIG. 11, the protective film 12 made of an epoxy-based resin, a polyimide-based resin or the like is formed on the lower surface, that is, the rough surface of the silicon substrate 1 by the screen printing method, a spin coat method or the like so that a lower surface of the protective film 12 may be flat. Alternately, the protective film may be formed in advance on a base sheet having a mold release agent on its surface, and this may be provided on the rear surface of the silicon substrate 1 by a transfer method. In this case, the lower surface of the silicon substrate 1 is the rough surface with a height difference of 1 to 5 µm as shown in FIG. 10, and this ensures that the rough surface is covered with the protective film 12.

Figure 12:
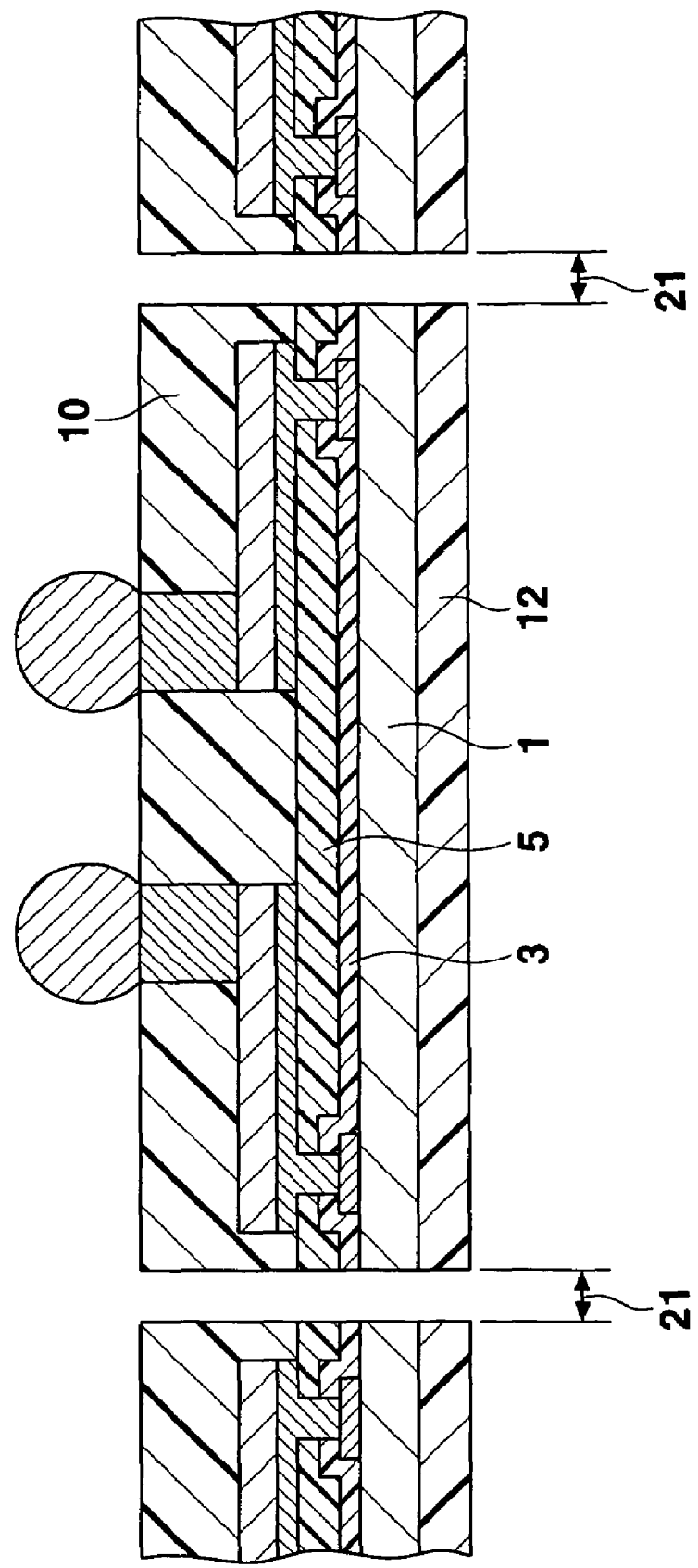
FIG. 12 is a sectional view of a step subsequent to FIG. 11.

Next, the solder ball 11 is formed on the upper surface of each of the columnar electrodes 9. Then, as shown in FIG. 12, the sealing film 10, the protective film 5, the insulating film 3, the silicon substrate or wafer 1 and the protective film 12 are cut along the dicing streets 21 by a dicing method, thereby obtaining a plurality of semiconductor devices shown in FIG. 1.

In each semiconductor device thus obtained, the lower surface of the silicon substrate 1 is the rough surface with a height difference of 1 to 5 µm, and this ensures that the rough surface can be covered with the protective film 12 as shown in FIG. 10, thereby making it possible to prevent the cracks from being easily caused in the lower surface of the silicon substrate 1.

Figure 13:
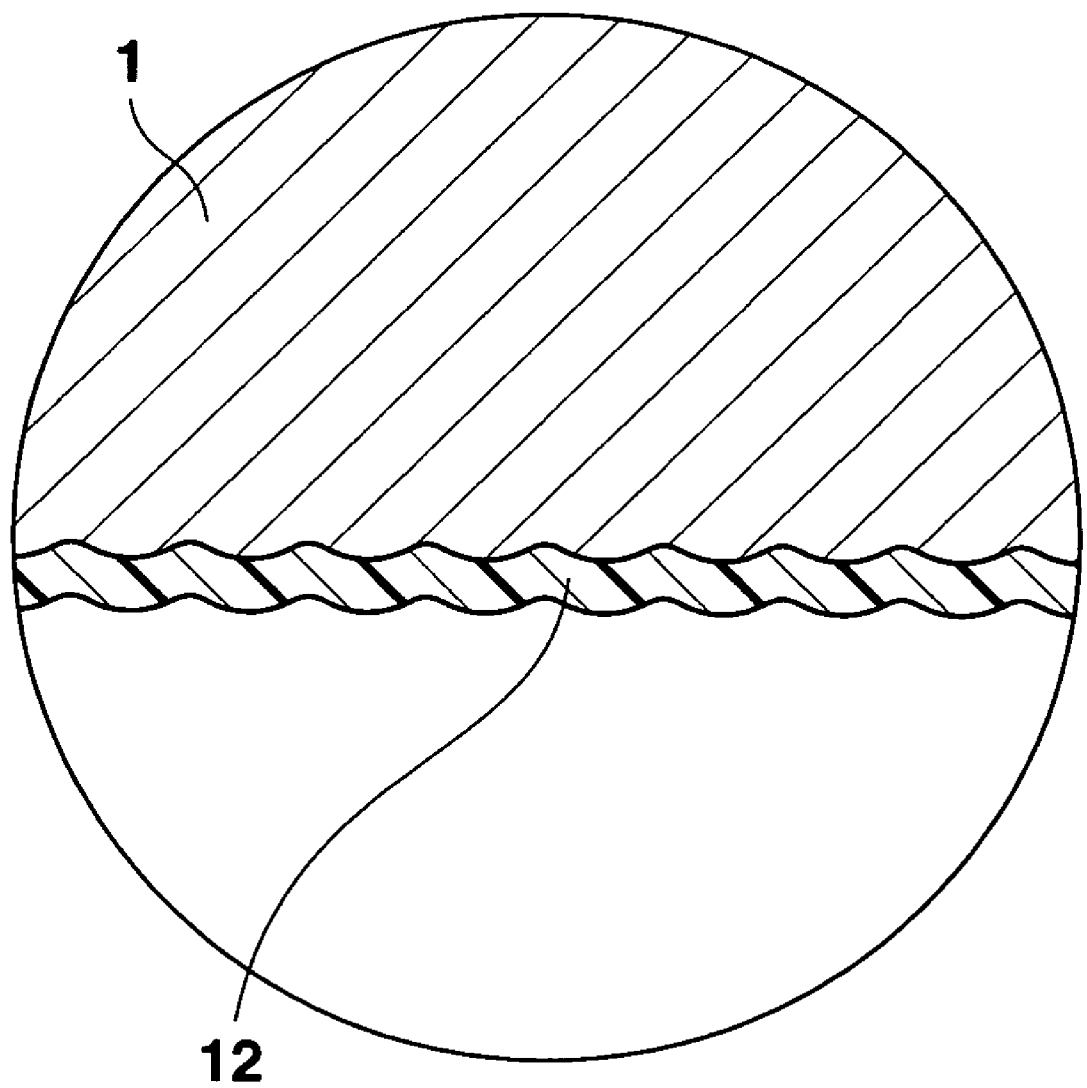
FIG. 13 is a partially enlarged sectional view of a step subsequent to FIG. 10 when a protective film is formed of a metal.

The protective film 12 may be formed of other materials such as a metal instead of the resin. Any metal material may be used as long as it has good properties to closely contact the silicon substrate 1 and has high mechanical strength. One example of such metal would be titanium. In this case, as shown in FIG. 13, the protective film 12 made of titanium is formed with a film thickness of about 1500 Å on the lower surface of the silicon substrate 1 by the sputter method or the like, after the step shown in FIG. 10. Since this protective film 12 made of titanium does not harden and contract unlike the resin, it is possible to prevent the silicon substrate 1 from warping.

Furthermore, this invention is not limited to the semiconductor device called CSP, and can also be applied to, for example, a semiconductor device wherein the foundation metal layer and the columnar electrode are formed on the connection pad 2 exposed via the opening 4 of the insulating film 3, and the sealing film is formed on the insulating film 3 on the periphery of the columnar electrodes, and the solder ball is formed on the columnar electrode.

Second Embodiment

Figure 14:
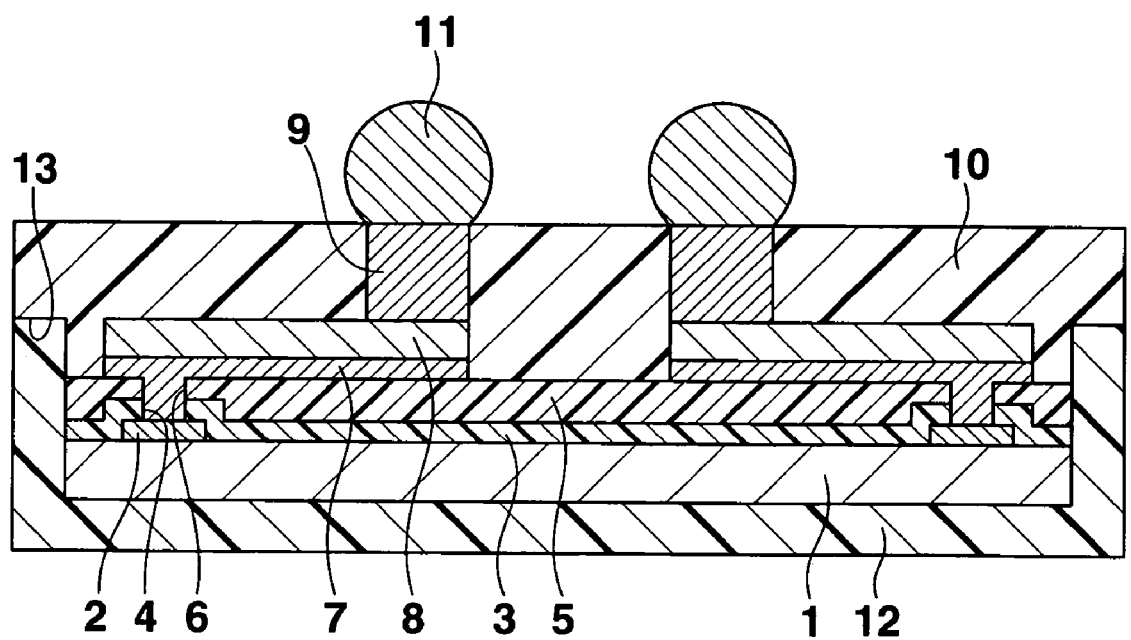
FIG. 14 is a sectional view of a semiconductor device as a second embodiment of this invention.

FIG. 14 shows a second embodiment of this invention. An integrated circuit (not shown) having a predetermined function is provided on an upper surface of a silicon substrate 1, and a plurality of connection pads 2 made of an aluminum-based metal or the like are provided on the periphery of the upper surface in such a manner as to be connected to the integrated circuit.

An insulating film 3 made of silicon oxide or the like is provided on the upper surface of the silicon substrate 1, and the connection pads 2 so that the center of each connection pad 2 is exposed via an opening 4 provided in the insulating film 3. A protective film 5 made of an epoxy-based resin, a polyimide-based resin or the like is provided on an upper surface of the insulating film 3. In this case, an opening 6 is provided in the protective film 5 in a part corresponding to the opening 4 of the insulating film 3.

Foundation metal layers 7 made of copper or the like are provided on an upper surface of the protective film 5. A wiring line 8 made of copper is provided on an entire upper surface of each of the foundation metal layers 7. One end of the wiring line 8 including the foundation metal layer 7 is electrically connected to the connection pad 2 via the openings 4 and 6 of the insulating film 3 and the protective film 5. A columnar electrode 9 made of copper is provided on an upper surface of the connection pad of the wiring line 8. A sealing film 10 made of an epoxy-based resin, a polyimide-based resin or the like is provided on the upper surfaces of the protective film 5 and wiring line 8 such that an upper surface of the sealing film 10 forms one surface together with an upper surface of the columnar electrode 9. A solder ball 11 is provided on the upper surface of each of the columnar electrodes 9.

Grooves 13 are provided on a peripheral side surface of the silicon substrate 1, a peripheral side surface of the insulating film 3, a peripheral side surface of the protective film 5 and a peripheral side surface lower portion of the sealing film 10. A protective film 12 made of an epoxy-based resin, a polyimide-based resin or the like is provided on a lower surface (rear surface) of the silicon substrate 1 and in the grooves 13. In this case, a peripheral side surface of the protective film 12 and a peripheral side surface upper portion of the sealing film 10 form one smooth surface or no-step surface.

Figure 15:
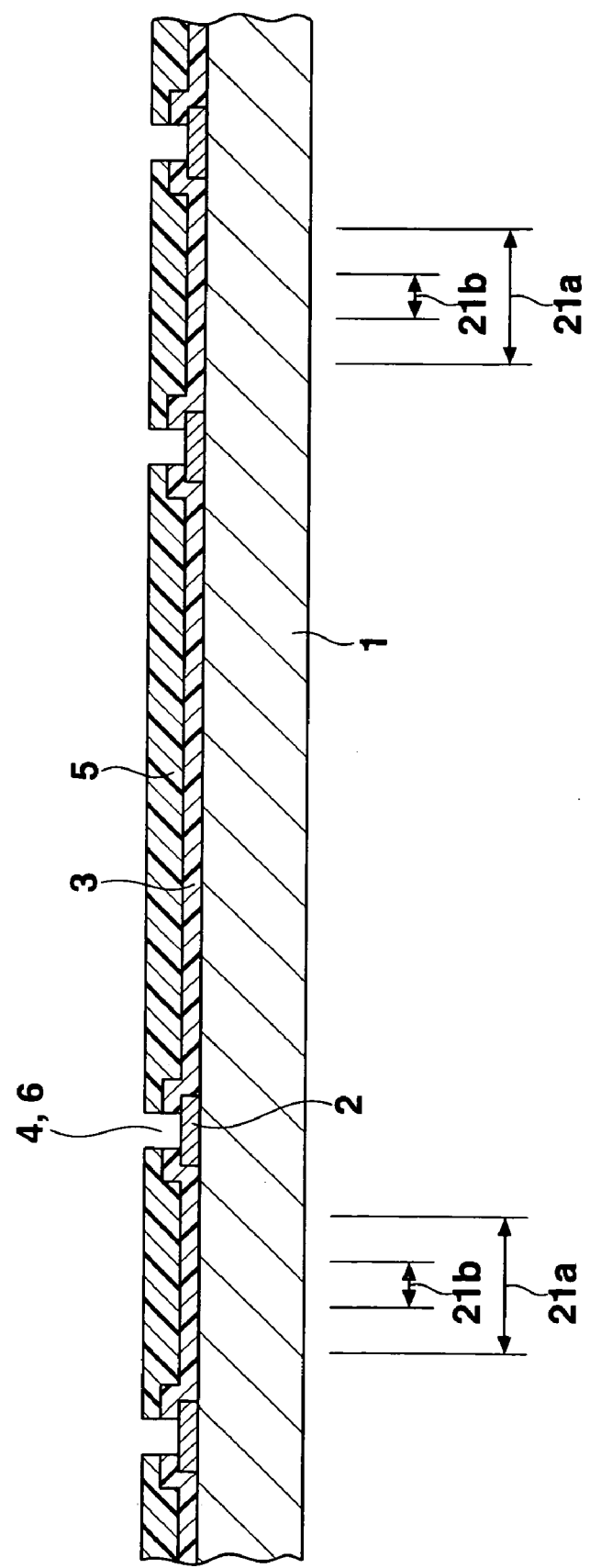
FIG. 15 is a sectional view of initially prepared components in one example of a method of manufacturing the semiconductor device shown in FIG. 14.

Next, one example of a method of manufacturing this semiconductor device will be described. First, as shown in FIG. 15, a material is prepared in which there are provided, on the silicon substrate 1 in a wafer state, the connection pads 2 made of an aluminum-based metal or the like, the insulating film 3 made of silicon oxide or the like, and the protective film 5 made of an epoxy-based resin, a polyimide-based resin or the like, wherein the center of each of the connection pad 2 is exposed via the openings 4 and 6 formed in the insulating film 3 and the protective film 5.

In this case, the integrated circuit having the predetermined function is formed on the silicon wafer 1 in an area where each of the semiconductor devices arranged in a matrix shape is formed, and each of the connection pads 2 is electrically connected to the integrated circuit formed in the corresponding area. Further, the thickness of the silicon wafer 1 is somewhat larger than the thickness of the silicon substrate 1 shown in FIG. 14. In FIG. 15, an area indicated by a reference numeral 21a is an area corresponding to first dicing streets, and an area indicated by a reference numeral 21b is an area corresponding to second dicing streets. In this case, the second dicing street 21b is in an area corresponding to the center in the width direction of the first dicing street 21a. The first and second dicing streets extend in two directions normal to each other.

Figure 16:
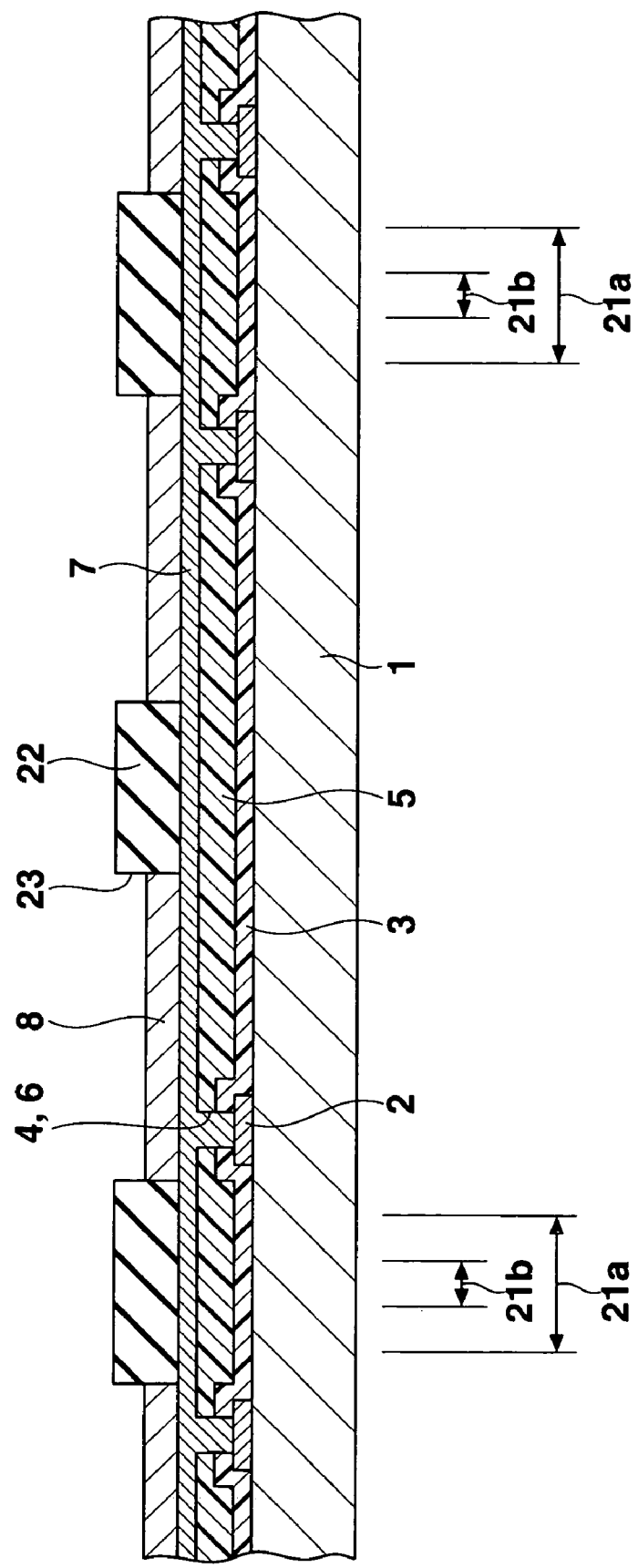
FIG. 16 is a sectional view of a step subsequent to FIG. 15.

Next, as shown in FIG. 16, the foundation metal layer 7 is formed on the entire upper surface of the protective film 5 and the center of the upper surface of each of the connection pads 2 exposed via the openings 4 and 6 of the insulating film 3 and the protective film 5. The foundation metal layer 7 may only be a copper layer formed by electroless plating, may only be a copper layer formed by sputtering, and may be a copper layer formed by sputtering on a thin film layer such as titanium formed by sputtering.

Next, a plating resist film 22 is formed and then patterned on the upper surface of the foundation metal layer 7. In this result, an opening 23 is formed in the plating resist film 22 in a part corresponding to an area where the wiring line 8 is to be formed. Then, electrolytic plating with copper is carried out using the foundation metal layer 7 as a plating current path, thereby forming the wiring line 8 on the upper surface of the foundation metal layer 7 in the opening 23 of the plating resist film 22. Then, the plating resist film 22 is removed.

Figure 17:
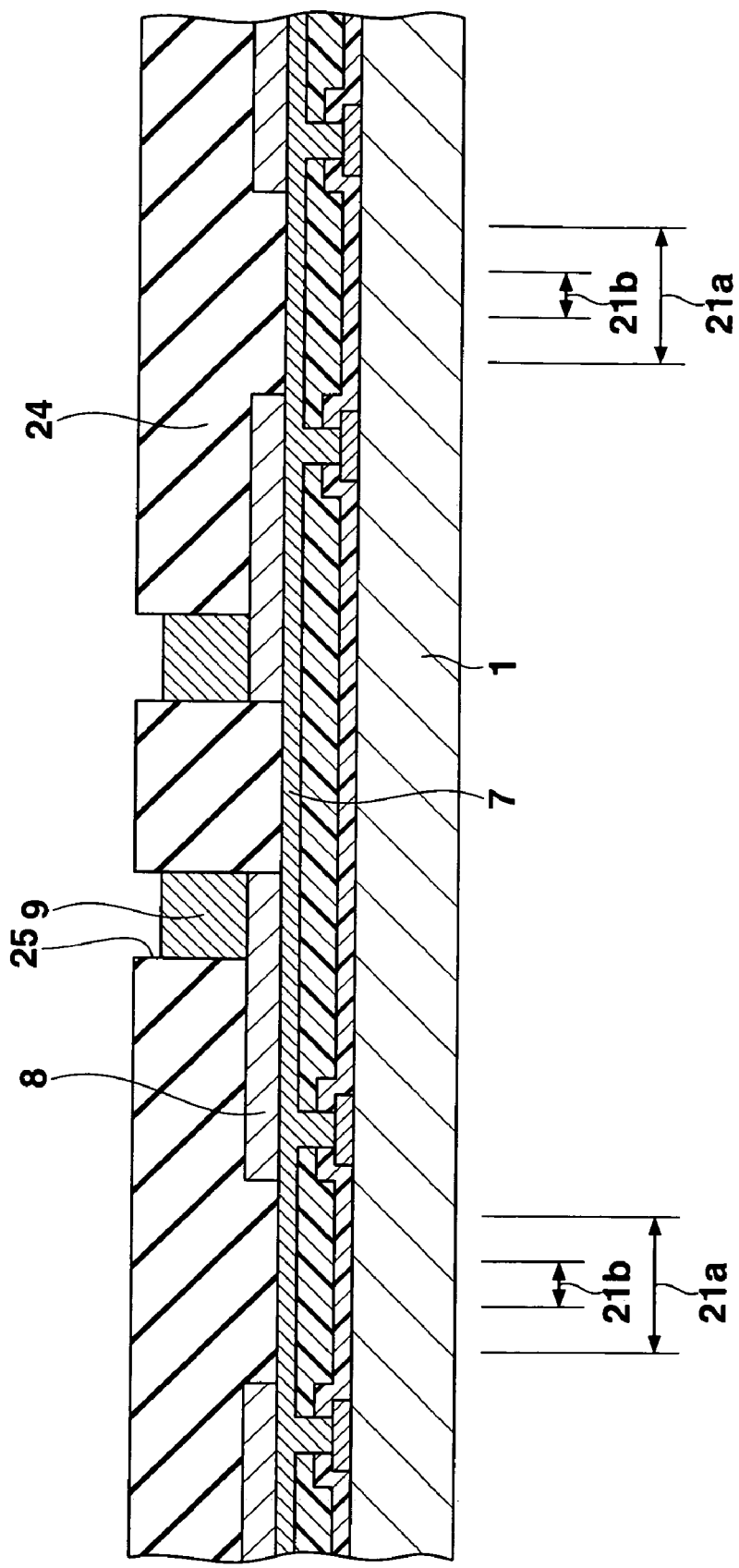
FIG. 17 is a sectional view of a step subsequent to FIG. 16.
Figure 18:
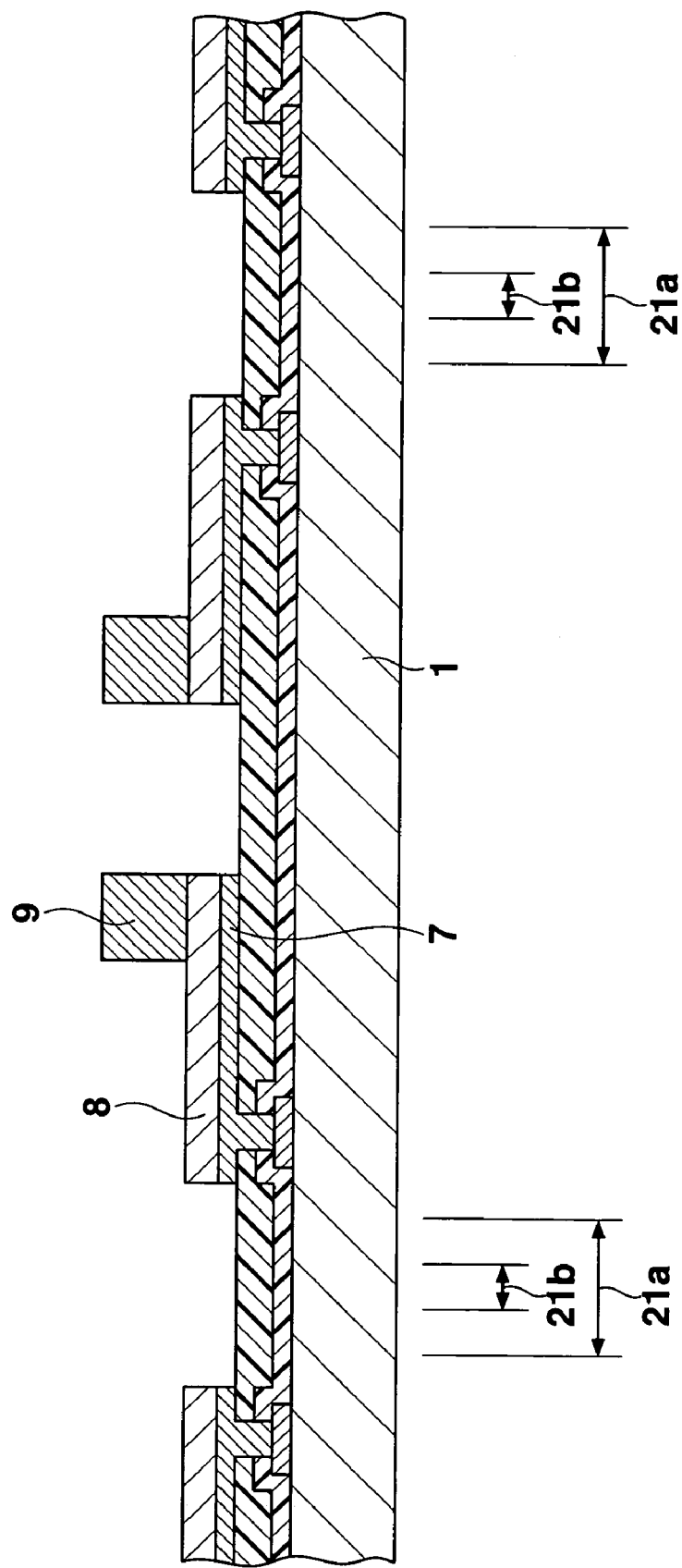
FIG. 18 is a sectional view of a step subsequent to FIG. 17.

Next, as shown in FIG. 17, a plating resist film 24 is formed and then patterned on the upper surface of the foundation metal layer 7 including the wiring line 8. In this result, an opening 25 is formed in the plating resist film 24 in a part corresponding to an area where the columnar electrode 9 is to be formed. Then, electrolytic plating with copper is carried out using the foundation metal layer 7 as a plating current path, thereby forming the columnar electrode 9 on the upper surface of the connection pad of the wiring line 8 in the opening 25 of the plating resist film 24. Subsequently, the plating resist film 24 is removed and then unnecessary portions of the foundation metal layer 7 are etched and removed using the wiring line 8 as a mask, whereby the part of the foundation metal layer 7 remains under the wiring line 8 alone, as shown in FIG. 18.

Figure 19:
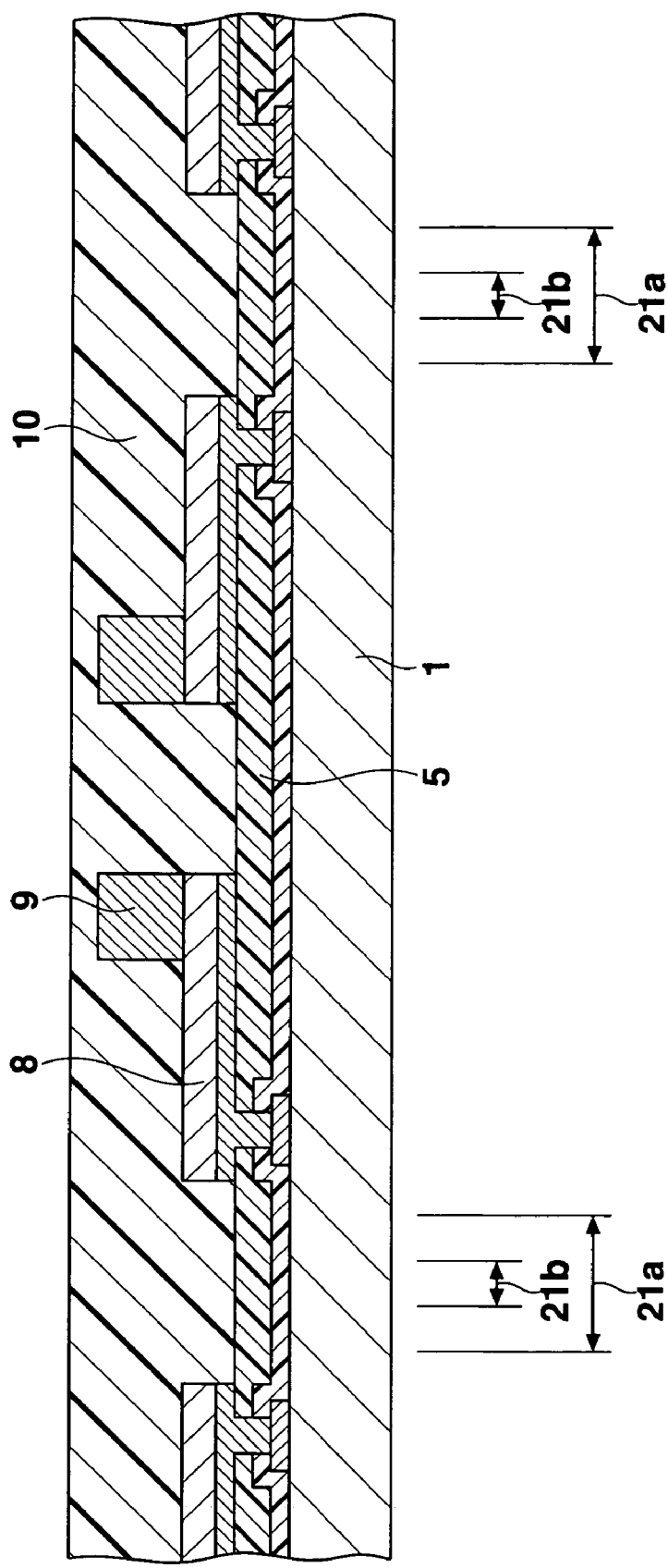
FIG. 19 is a sectional view of a step subsequent to FIG. 18.

Next, as shown in FIG. 19, the sealing film 10 made of an epoxy-based resin, a polyimide-based resin or the like is formed on the entire upper surface of the protective film 5, the columnar electrode 9 and the wiring line 8 by a screen printing method, a spin coat method or the like so that the thickness of the sealing film 10 is larger than the height of the columnar electrode 9. Therefore, in this state, the upper surface of each of the columnar electrodes 9 is covered with the sealing film 10.

Figure 20:
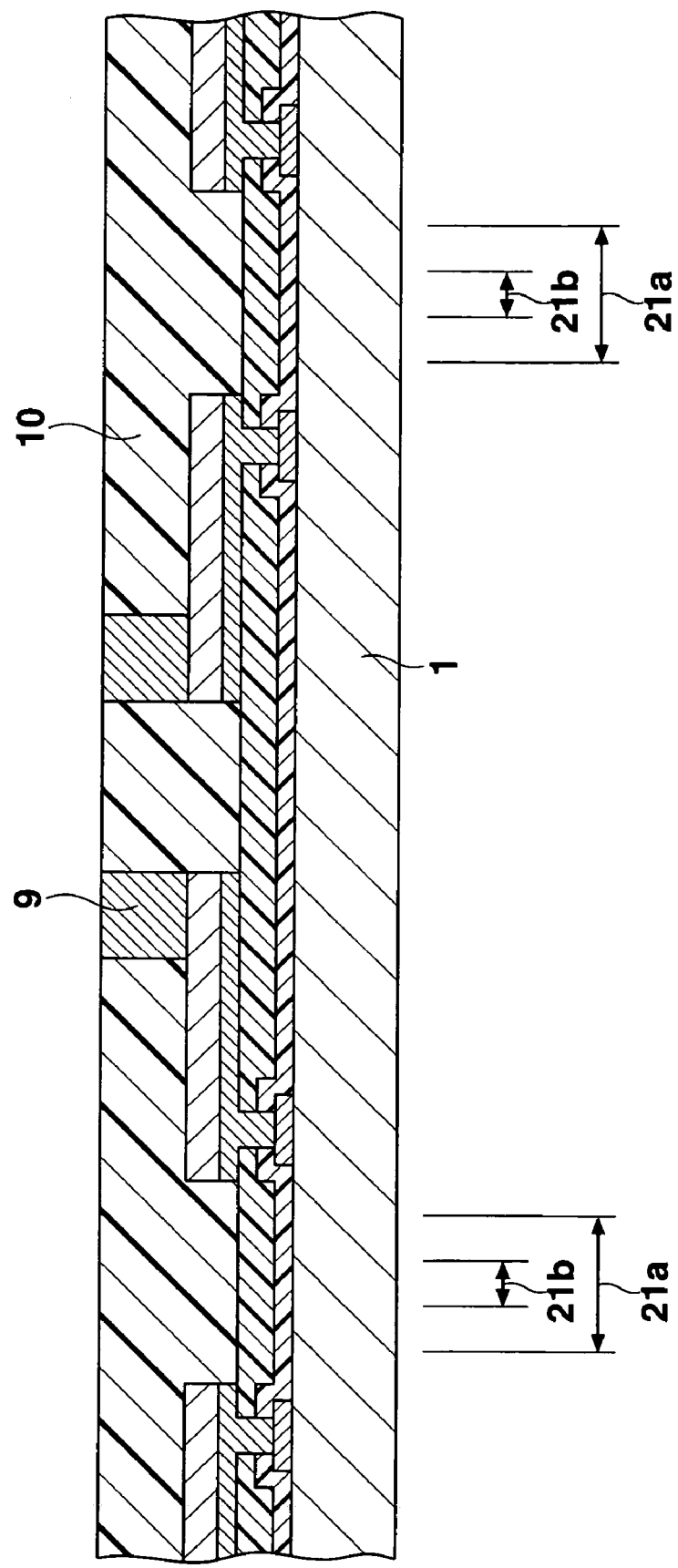
FIG. 20 is a sectional view of a step subsequent to FIG. 19.

Next, upper surface sides of the sealing film 10 and the columnar electrode 9 are properly polished, and as shown in FIG. 20, the upper surface of the columnar electrode 9 is exposed, and the upper surface of-the sealing film 10 and the exposed upper surface of the columnar electrode 9 is planarized. Here, the upper surface side of the columnar electrode 9 is properly polished for the reason that, due to variation in the height of the columnar electrodes 9 formed by electrolytic plating, this variation is eliminated to uniform the height of the columnar electrodes 9.

Figure 21:
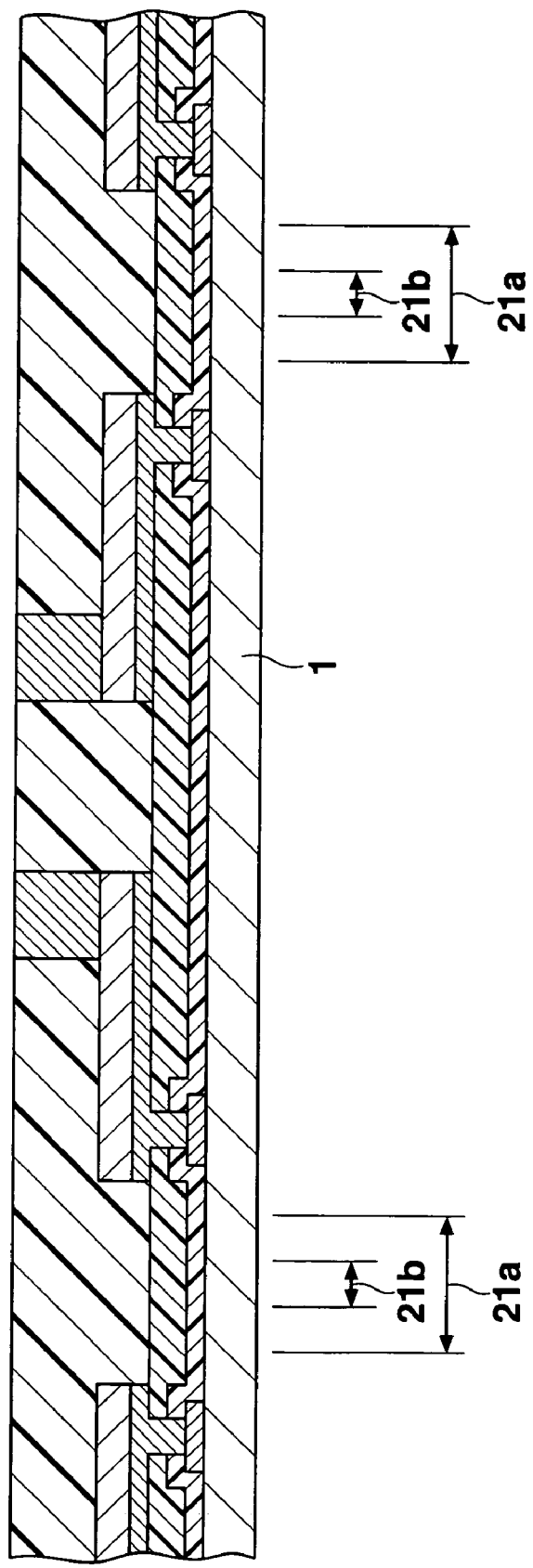
FIG. 21 is a sectional view of a step subsequent to FIG. 20.
Figure 22:
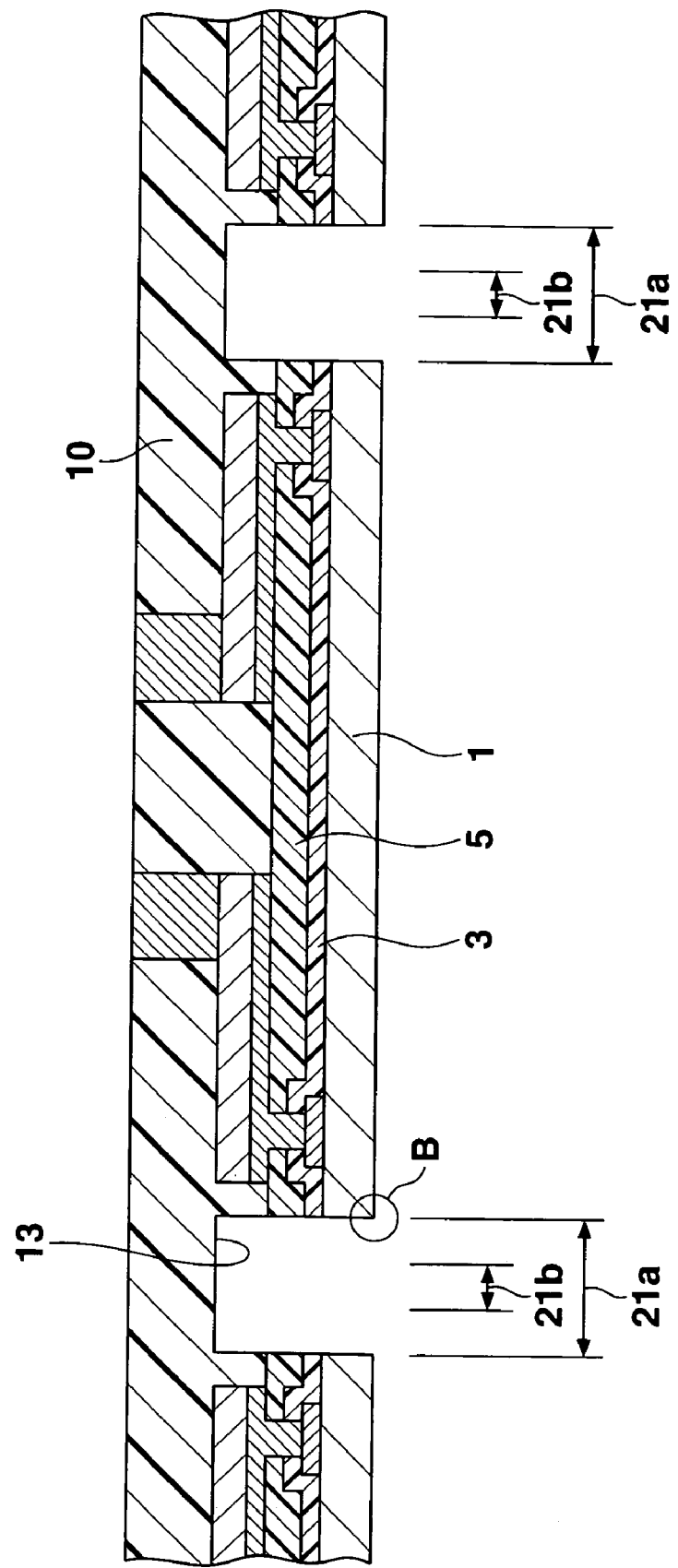
FIG. 22 is a sectional view of a step subsequent to FIG. 21.

Next, as shown in FIG. 21, the lower surface (rear surface) side of the silicon substrate or wafer 1 is properly ground to reduce the thickness of the silicon substrate 1. Then, as shown in FIG. 22, half-cut is implemented from the lower surface side of the silicon substrate 1 to the halfway point of the sealing film 10 by a dicing method along the first dicing streets 21a, that is, the silicon substrate 1, the insulating film 3 and the protective film 5 are fully cut, and the sealing film 10 is half-cut, thereby forming the grooves 13. In this state, the silicon wafer 1 is separated into the individual silicon substrates 1, but each of the silicon substrates 1 is not substantially separated because the sealing film 10 is half-cut. This half-cut process may be performed in a state where the upper surfaces of the sealing film 10 and the columnar electrode 9 adhere to a dicing tape (not shown).

Figure 23:
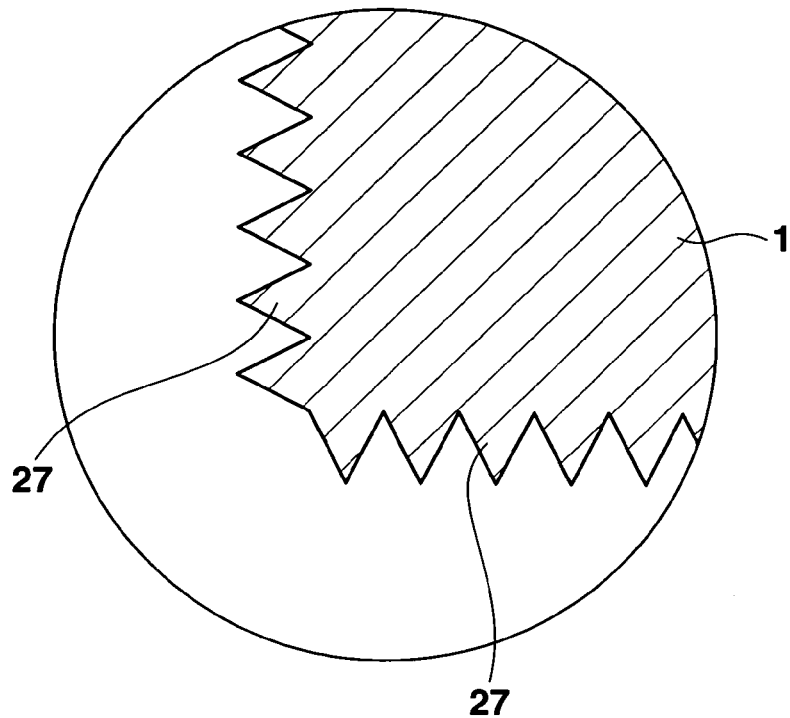
FIG. 23 is a partially enlarged sectional view showing a B portion of FIG. 22 in detail.

Here, if the lower surface of the silicon wafer 1 is ground, or if the silicon wafer 1 is diced, minute and acutely-angled irregularities (a silicon crystal-destroyed layer) 27 are formed on the lower surface and peripheral side surface of the silicon wafer 1 as shown in FIG. 23 which is a partially enlarged sectional view showing a B portion of FIG. 22 in detail. The minute and acutely-angled irregularities 27 cause cracks in the lower surface and peripheral side surface of the silicon wafer 1.

Thus, wet etching is then implemented which uses a mixed solution of nitric acid, hydrofluoric acid and acetic acid or this mixed solution to which water is added. In this wet etching, the lower surface and peripheral side surface of the silicon wafer 1 are oxidized by nitric acid to form an oxide film, and this oxide film is dissolved by hydrofluoric acid and removed, and then a reaction is controlled by acetic acid. In this case, the lower surface and peripheral side surface of the silicon wafer 1 can be mirror-finished depending on conditions such as a composition ratio or processing time of the mixed solution, but it is preferable that the lower surface and peripheral side surface of the silicon wafer 1 are finished as a rough surface having a height difference of 1 to 5 μm so that the silicon wafer 1 is less susceptible to light.

Figure 25:
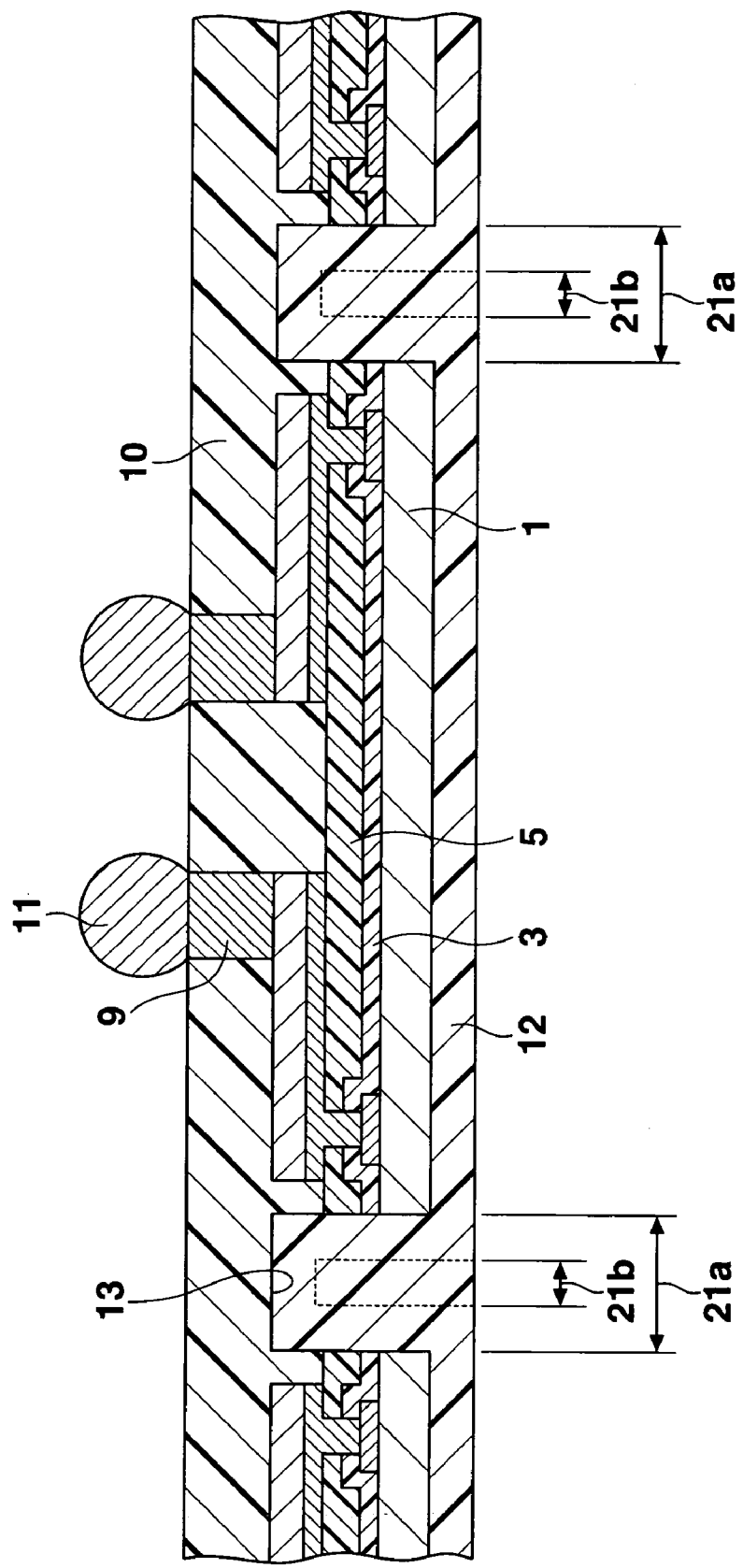
FIG. 25 is a sectional view of a step subsequent to FIG. 24.

Next, as shown in FIG. 25, the protective film 12 made of an epoxy-based resin, a polyimide-based resin or the like is formed on the lower surface of the silicon wafer 1 and in the grooves 13 by the screen printing method, a spin coat method or the like so that an entire lower surface of the protective film 12 may be substantially flat. In this state, the peripheral side surfaces of the silicon wafer 1, the insulating film 3, the protective film 5 and the sealing film 10 in the grooves 13 are covered with the protective film 12 formed in the grooves 13. In this case, especially, the lower surface and peripheral side surface of the silicon wafer 1 are the rough surfaces with a height difference of 1 to 5 μm as shown in FIG. 11, and this ensures that the rough surfaces are covered with the protective film 12. Moreover, since the silicon wafer 1 is separated into the individual substrates, it is possible to prevent the resultant silicon substrate 1 from easily warping even if the protective film 12 made of an epoxy-based resin or the like hardens and contracts.

Next, the solder ball 11 is formed on the upper surface of each of the columnar electrodes 9. Then, as shown in FIG. 26, the protective film 12 and the sealing film 10 are fully cut along the second dicing streets 21b, that is, along the center in the width direction of the protective film 12 formed in the grooves 13 by the dicing method, thereby obtaining a plurality of semiconductor devices shown in FIG. 14.

Figure 24:
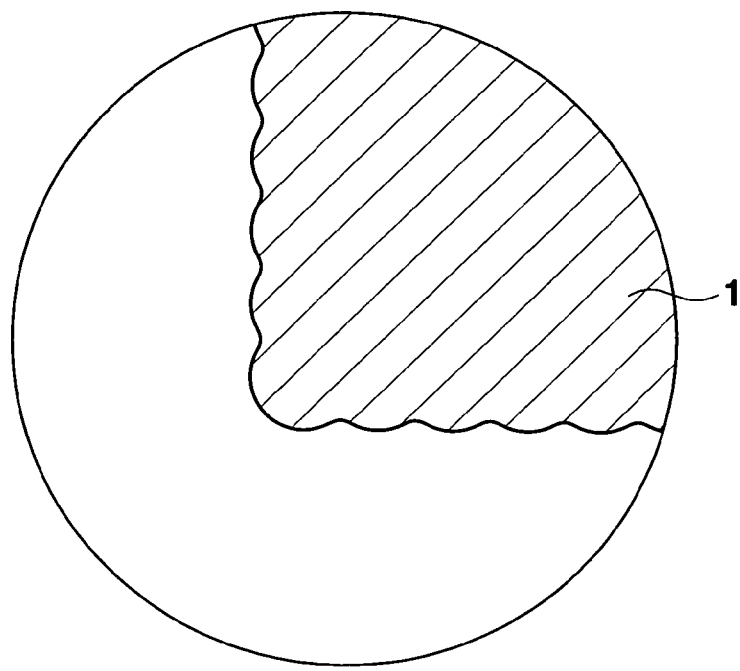
FIG. 24 is a partially enlarged sectional view of a step subsequent to FIG. 23.

In the semiconductor device thus obtained, the lower surface and peripheral side surface of each of the resultant silicon substrates 1 are the rough surfaces with a height difference of 1 to 5 μm, and this ensures that the rough surface can be covered with the protective film 12 as shown in FIG. 24, thereby making it possible to prevent the cracks from being easily caused in the lower surface and peripheral side surface of the silicon substrate 1.

The protective film 12 may be formed of a metal instead of the resin. Any metal material may be used as long as it has good properties to closely contact the silicon substrate 1 and has high mechanical strength, and one example would be titanium. In this case, to explain referring to FIG. 25, the protective film 12 made of titanium is formed with a film thickness of about 1500 Å on the lower surface of the silicon substrate 1 including the grooves 13 by the sputter method or the like, after the step shown in FIG. 24. In this case, as indicated by a dotted line in FIG. 25, the protective film 12 is formed at a uniform thickness from the side surface and bottom surface of the groove 13. Since the protective film 12 made of a metal film such as titanium does not harden and contract unlike the resin, it is possible to prevent the silicon substrate 1 from warping.

Furthermore, in the embodiment described above, the half-cut is implemented from the lower surface side of the silicon substrate 1 to the halfway point of the sealing film 10 to form the groove 13, but in FIG. 21, if the upper surfaces of the sealing film 10 and the columnar electrode 9 adhere to a dicing tape (not shown), the silicon wafer 1 and the sealing film 10 can be fully cut. In that case, subsequent steps can be implemented as in the embodiment described above, but the protective film formed on the corresponding dicing tape in the groove can only be cut to produce the individual semiconductor substrates. Moreover, this invention is not limited to the semiconductor device called CSP, and can also be applied to, for example, a semiconductor device wherein the foundation metal layer and the columnar electrode are formed on the connection pad 2 exposed via the opening 4 of the insulating film 3, and the sealing film is formed on the insulating film 3 on the periphery of the columnar electrodes, and the solder ball is formed on the columnar electrode.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A method of manufacturing a semiconductor device, comprising:
    forming columnar electrodes on a semiconductor wafer;
    forming a sealing film on the semiconductor wafer between peripheries of the columnar electrodes;
    grinding a rear surface of the semiconductor wafer;
    cutting from a rear surface side of the semiconductor wafer to at least a halfway point of the sealing film to form grooves for separating the semiconductor wafer into individual semiconductor substrates;
    roughening the rear surface and side surface of the semiconductor wafer by wet etching;
    forming a protective film on the rear surface of the semiconductor wafer and inside of the grooves; and
    cutting the protective film formed in the grooves to obtain a plurality of semiconductor devices.

2. The method according to claim 1, wherein the protective film is formed of a resin.

3. The method according to claim 1, wherein the protective film is formed of a metal.

4. The method according to claim 1, wherein the semiconductor wafer has an integrated surface formed on a front surface thereof, which is opposite to the rear surface.

5. The method according to claim 4, wherein the columnar electrodes are formed on the front surface of the semiconductor wafer.

6. The method according to claim 1, wherein the rear surface of the semiconductor wafer is roughened to be a rough surface with a height difference of 1 to 5 μm.

7. The method according to claim 1, wherein the rear surface and the side surface of the semiconductor wafer are roughened to be rough surfaces with a height difference of 1 to 5 μm.

8. The method according to claim 1, wherein the rear surface and the side surface of the semiconductor wafer are roughened to be rough surfaces having a plurality of concave and convex portions, and wherein a height difference between a base of each of the concave portions to a top of an adjacent one of the convex portions is 1 to 5 μm.

9. The method according to claim 8, wherein the convex portions are substantially arc-shaped.

10. The method according to claim 1, further comprising forming a solder ball on each of the columnar electrodes.

11. The method according to claim 10, wherein the solder balls are formed on the columnar electrodes before the cutting to obtain the semiconductor devices is performed.

12. The method according to claim 1, wherein said cutting to obtain the semiconductor devices comprises cutting through the sealing film above the grooves.

13. The method according to claim 12, wherein in each of the semiconductor devices obtained by said cutting, a side surface of the sealing film obtained by said cutting forms one surface together with a side surface of the protective film obtained by said cutting.

14. The method according to claim 1, wherein the semiconductor wafer includes a plurality of connection pads, wherein the method further comprises forming wiring connected to the connection pads, and wherein the columnar electrodes are formed on the wiring.

15. The method according to claim 14, further comprising forming an insulating film on a front surface, opposite to the rear surface, of the semiconductor wafer, and forming a protective film on the insulating film;
    wherein the wiring is formed on the protective film and is connected to the connection pads through holes in the protective film and the insulating film.

16. The method according to claim 15, wherein an integrated circuit is formed on the front surface of the semiconductor wafer, and the connection pads are connected to the integrated circuit.

17. A method of manufacturing a semiconductor device, comprising:
    forming columnar electrodes to be connected to connection pads on a front surface of a semiconductor wafer;
    forming a sealing film between peripheries of the columnar electrodes;
    grinding a rear surface of the semiconductor wafer to reduce a thickness of the semiconductor wafer;
    cutting from a rear surface side of the semiconductor wafer to at least a halfway point of the sealing film to form grooves;
    roughening the rear surface and side surface of the semiconductor wafer by wet etching;
    forming a protective film on the rear surface of the semiconductor wafer and inside of the grooves; and
    cutting the protective film formed in the grooves and the sealing film provided above the grooves to obtain a plurality of semiconductor devices.

* * * * *